US007002258B2

(12) United States Patent
Mali et al.

(10) Patent No.: US 7,002,258 B2
(45) Date of Patent: Feb. 21, 2006

(54) DUAL PORT MEMORY CORE CELL ARCHITECTURE WITH MATCHED BIT LINE CAPACITANCES

(75) Inventors: Jim Mali, La Selva Beach, CA (US); Betina Hold, El Dorado Hills, CA (US)

(73) Assignee: ARM Physical IP, Inc., Sunnyvale, CA (US)

( * ) Notice: Subject to any disclaimer, the term of this patent is extended or adjusted under 35 U.S.C. 154(b) by 0 days.

(21) Appl. No.: 10/727,760

(22) Filed: Dec. 3, 2003

(65) Prior Publication Data

US 2005/0121810 A1   Jun. 9, 2005

(51) Int. Cl.
*H01L 27/11* (2006.01)
(52) U.S. Cl. ........................ 257/903; 257/904
(58) Field of Classification Search ............. 257/903, 257/904, 905, 206, 207, 208, 355
See application file for complete search history.

(56) References Cited

U.S. PATENT DOCUMENTS 5,843,816 A * 12/1998 Liaw et al. .................. 438/238
6,573,166 B1 * 6/2003 Chen .......................... 438/519
6,621,125 B1 * 9/2003 Wang .......................... 257/355
6,657,243 B1 * 12/2003 Kumagai et al. ............ 257/206

OTHER PUBLICATIONS

Stanley Wolf, Silicon Processing for the VLSI area vol. 3, Press (1995) p. 137.*

* cited by examiner

Primary Examiner—David Nelms
Assistant Examiner—Thinh T Nguyen
(74) Attorney, Agent, or Firm—Martine Penilla & Gencarella, LLP

(57) ABSTRACT

A Static Random Access Memory (SRAM) dual port memory with an improved core cell design having internally matched capacitances and decreased bit line capacitance is disclosed. The core cell is fabricated on a substrate divided into three approximately equal columns of different substrate materials. In a preferred embodiment, the memory cell is fabricated on a central p-type column that in turn is sandwiched between two n-type columns. The three-column substrate architecture permits reduced bit line height, with an accompanying reduction in bit line capacitance, which increases the speed at which the core cell can operate. The architecture also permits separating the core cell's bitline and complement bitline, reducing capacitive coupling between these lines and increasing the core cell's operating speed. The architecture further permits better matching of internal node capacitances.

7 Claims, 7 Drawing Sheets

DUAL PORT MEMORY CORE CELL ARCHITECTURE WITH MATCHED BIT LINE CAPACITANCES

BACKGROUND OF THE INVENTION

1. Field of the Invention

The present disclosure relates generally to the design and manufacture of Integrated Circuits (ICs). More specifically, the present invention relates to the design of Random Access Memory (RAM) ICs.

2. Description of the Related Art

Semiconductor memory is typically laid out as an array of core cells, such that each individual core cell is coupled to a wordline and a pair of differential bitlines, as well as a power and ground connection. To read or write data from or to a selected core cell requires addressing circuitry for selecting the core cell, wordline drivers for driving the selected wordline and sense amplifiers for amplifying the signals that are read from the selected core cell and output buffers.

FIG. 1a is a simplified diagram of a memory 10 consisting of an array of core cells 12. Each of the core cells 12 is connected to a pair of bitlines, such as bitline (BL) 14 and a complementary bitline (/BL) 16. Each core cell is also electrically coupled to other core cells 12 along horizontal wordlines (WL) 18. Sense amplifying circuitry is usually implemented to read data, and write drivers to write data into selected core cells 12.

Although conventional sense amplifying circuitry has worked well in the past for sensing voltage differentials between the bitlines 14 and 16, higher performance memory now requires the ability to sense very small voltage differentials between the bitlines. Previously, sense amplifiers were required to sense voltage differentials of approximately 500 millivolts (mV) between the bitlines 14 and 16 to read data that was stored in a particular core cell 12. Due to expected fabrication imperfections and circuit layout constraints, there is usually a voltage offset between the bitlines 14 and 16. Voltage offsets are typically between 5 to 30 millivolts.

Although such offsets are typical, they were insignificant compared to the 500 millivolt voltage differential required for triggering amplification by a sense amplifier. However, higher performance memory now requires that amplification by the sense amplifier occur at much faster rates. Current sense amplifiers must respond more quickly and are required to sense voltage differentials of between about 15 and 60 millivolts across the bitlines. Unfortunately, typical voltage offsets in the range of 5 to 30 millivolts will necessarily begin to hamper the speed at which sense amplification may occur.

FIG. 1b shows a pair of exemplary bitlines 14 and 16 that are interconnecting successive core cells 12 in the vertical column direction. Also shown are representative wordlines 18 that horizontally interconnect each of the core cells 12. The core cells 12 are typically symmetric data latching circuits that have cross-coupled inverters and passgate transistors that are coupled to respective wordlines 18. Although the core cells 12 are symmetric in their schematic circuit representation, the resulting geometric shape and layout orientation on a semiconductor substrate will usually be less than perfectly symmetric.

As a result, the capacitive loading experienced on each of the respective bitlines 14 and 16 will not be equal. When the voltage at point 32 is driven to rail voltage ($V_{dd}$), capacitive coupling of $C_1$ will occur between pre-charged transistors 30 and the bitlines 14 and 16. As pictorially shown in FIG. 1b, if the capacitive loading in the bitline 14 is "C+ΔC" and the capacitive loading in the complementary bitline 16 is "C," then there will be a voltage offset of ΔV between bitlines 14 and 16 due to miller coupling capacitance. Other contributions to the offset are the result of process variation in the fabrication of the memory and different device size and strength. Bitline 14 may have a voltage of V and the complementary bitline 16 may have a voltage of V+ΔV. It is this voltage offset that becomes problematic when voltage sensing between the bitlines is required at lower voltage differentials. This problem occurs while reading a low on complementary bitline 16, when the complementary bitline has a voltage of V+ΔV.

FIG. 1c shows bitline 14 and the complementary bitline 16 graphed in terms of voltage and time, and illustrating that sense application will occur when accessing data of a particular core cell 12. In this example, the voltage offset is shown to be 15 millivolts (mV) between the bitline 14 and the complementary bitline 16. When sensing the digital data that is stored in this particular core cell, the complementary bitline 16 will begin to fall at time $T_0$. The complementary bitline 16 must first cross the bitline 14 at time $T_1$. Therefore, a higher performance sense amplifier that is required to detect about 30 mV difference between the bitlines, and which must also cope with voltage offsets of 15 mV, will not commence its amplification until time $T_3$.

If there were no voltage offset between the bitlines as represented by a complimentary bitline 16', a sense amplifier would be able to sense a voltage differential of 30 mV much more rapidly at a time $T_2$. Thus, even very small voltage offsets have substantial performance deteriorating ramifications. Unfortunately, conventional memory device performance is limited by the expected fabrication imperfections and layout constraints that produce imbalances in capacitive loading of the bitlines of each core cell 12.

The design and fabrication of both static RAM (SRAM) with single and multiple ports and dynamic RAM (DRAM) is well known. A schematic of a known SRAM single port core cell is illustrated in FIG. 2. Core cell 20 is comprised of two inverters 21 the output of each inverter being coupled to the input of the other inverter. Inverters 21 store the binary "0" or "1" that forms the content of the core cell. Each core cell 20 is coupled to a pair of bit lines 23, which bit lines carry the data into and out of the core cell, and a word line 25, which word line indicates when it is asserted that either a new value will be written to core cell 20 or the contents of core cell 20 will be read. Access transistors 27 switch on to permit data placed on bit lines 23 to flow into inverters 21 of core cell 20 or out of core cell 20 onto the bit lines when core cell 20's word line 25 is asserted. This type of core cell is sometimes called a 6T cell, as it is fabricated from six transistors (each inverter 21 requires two transistors and the two access transistors 27). The design and fabrication of core cell 20 and similar core cells are known to those of skill in the art.

Dual port SRAM core cells are also known. FIG. 3 is a schematic of a dual port core cell 50 that is very similar to the single port core cell illustrated in FIG. 2. In all figures referenced by this specification, similar parts have the same part number. The main differences between a single port and a dual port core cell are the provision of a second word line 29 and a second set of bit lines 31. The addition of second word line 29 requires an additional two access transistors 27 coupled to second word line 29, the bit lines 23 and 31 and the inverters. As with single port SRAM core cells, dual port core cells are known and their design and fabrication require no extensive description here.

A commonly used IC layout used to fabricate the dual port core cell shown in FIG. 3 is illustrated in FIG. 4. Approximately $\frac{2}{3}^{rds}$ of the cell's area comprises an p-type substrate 43 for the fabrication of n-type transistors and the other $\frac{1}{3}^{rd}$ of the cell's surface area comprises a n-type substrate 45 for the fabrication of p-type transistors. These n-type and p-type transistors are then coupled together to form inverters 21. Trace 41 in FIG. 4 indicates the areas of the cell that are interconnected to form one of the inverters. Metal interconnections are run through and across the cell to various points, creating the bit lines, the word lines and the power and ground lines. The metal interconnections are not illustrated in FIG. 4.

Although well known, dual port memory core cells laid out in the manner shown in FIG. 4 have certain performance limitations and problems. The height (indicated as "H" in FIG. 4) of these dual port memory core cells is great enough so that cumulatively the bit lines running to the transistors in a column of core cell have sufficient capacitance to affect the speed of the core cell materially. The bitlines are also typically closer together than is optimal, resulting in charge coupling between the bitlines, which reduces the speed of the core cell. Given the layout of known SRAM core cells, it is not possible to move the bitlines sufficiently far apart to eliminate this problem. Capacitance matching on the various bitlines is also difficult and limited space in the core cell prevents moving bitlines around to reduce this problem.

A core cell for either a dual port or single port SRAM memory with reduced height bit lines and reduced charge coupling on the bitlines would be a desirable improvement.

SUMMARY OF THE INVENTION

A core cell with an expanded layout is described herein as a preferred embodiment of the present invention. The cell is fabricated upon a three column substrate of N-type substrate, P-type substrate and N-type substrate. The core cell fabricated upon this three column substrate is reduced in height with respect to known core cells and only slightly wider than known core cells. The completed core cell is no larger in total area than known core cells and the wider but reduced height architecture allows for numerous advantages in the completed core cell.

Core cells fabricated using this preferred embodiment are reduced in overall height from known core cells, which in turn reduces the length of the bitlines running down a column of core cells. The reduced bit line height in the preferred embodiment in turn reduces the bit line capacitance, resulting in faster memory operation. The preferred embodiment also improves the internal capacitance balance as a result of improved matching of internal node capacitances permitted by the new architecture. The improved capacitance balance also improves overall memory performance.

The expanded architecture also greatly simplifies the placement and routing of the power lines and bitlines in the completed core cell. As will be shown in the detailed description of the preferred embodiments, the bitlines and their complement bitlines are separated by either ground lines or power lines. The separation of the bitlines and bitline complements eliminates capacitive coupling between these lines and also results in faster memory operation.

Core cells fabricated on a substrate fabricated according to the present invention are symmetrical in layout and can be flipped about their X and Y axis as needed to offset bitline and word line voltage mismatches. This new layout also permits vertical power lines, both $V_{DD}$ and ground, which improves the power grid structure and also separates the bitlines. The separate power lines also permit simplified voltage biasing to reduce transistor leakage.

These and other aspects and advantages of the invention will become apparent from the following detailed description in conjunction with the accompanying drawings, wherein like reference numerals designate like structural elements.

DETAILED DESCRIPTION OF THE PREFERRED EMBODIMENTS

FIGS. 1a, 1b, 1c, 2, 3 and 4 have already been described and discussed as the relevant background to the present invention. They require no further discussion here.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 5:
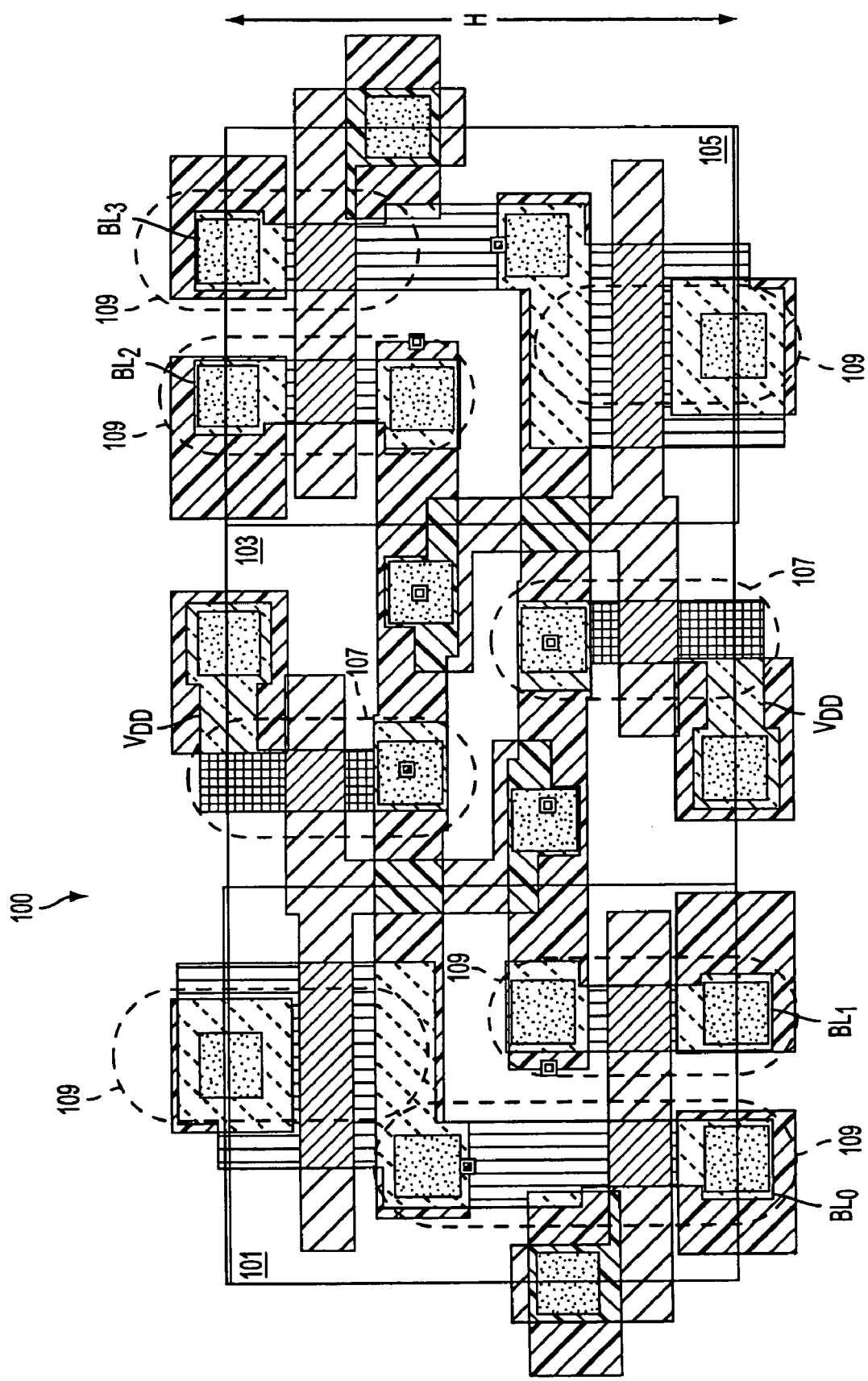
FIG. 5 is a top down perspective of the silicon layout of a first embodiment of the present invention.

FIG. 5 illustrates the final device layout of a core cell fabricated according to the first embodiment of the present invention. Core cell 100 is fabricated upon a substrate of first p-type substrate 101, first n-type substrate 103 and second p-type substrate 105. Two pmos transistors 107 are fabricated on substrate 103 and 6 nmos transistors 109 are fabricated on substrates 101 and 105. The process steps required to fabricate these transistors are known and require no further description here. Black areas in FIG. 5 indicate where a via has been made from the various overlying metal layers (see FIG. 6), which form the ground, $V_{DD}$ and bitlines, into the diffusion layer or polysilicon layer of the underlying transistors. The formation of these vias is conventional and does not require discussion here.

Figure 1A:
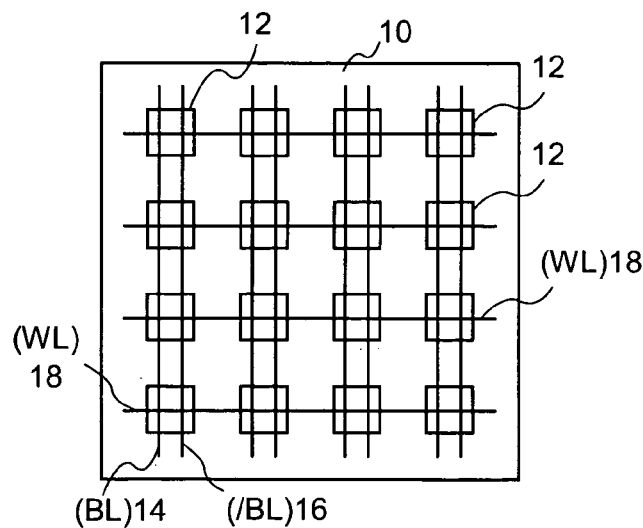
FIG. 1a is a diagram of a memory that has an array of core cells (Prior Art)
Figure 1B:
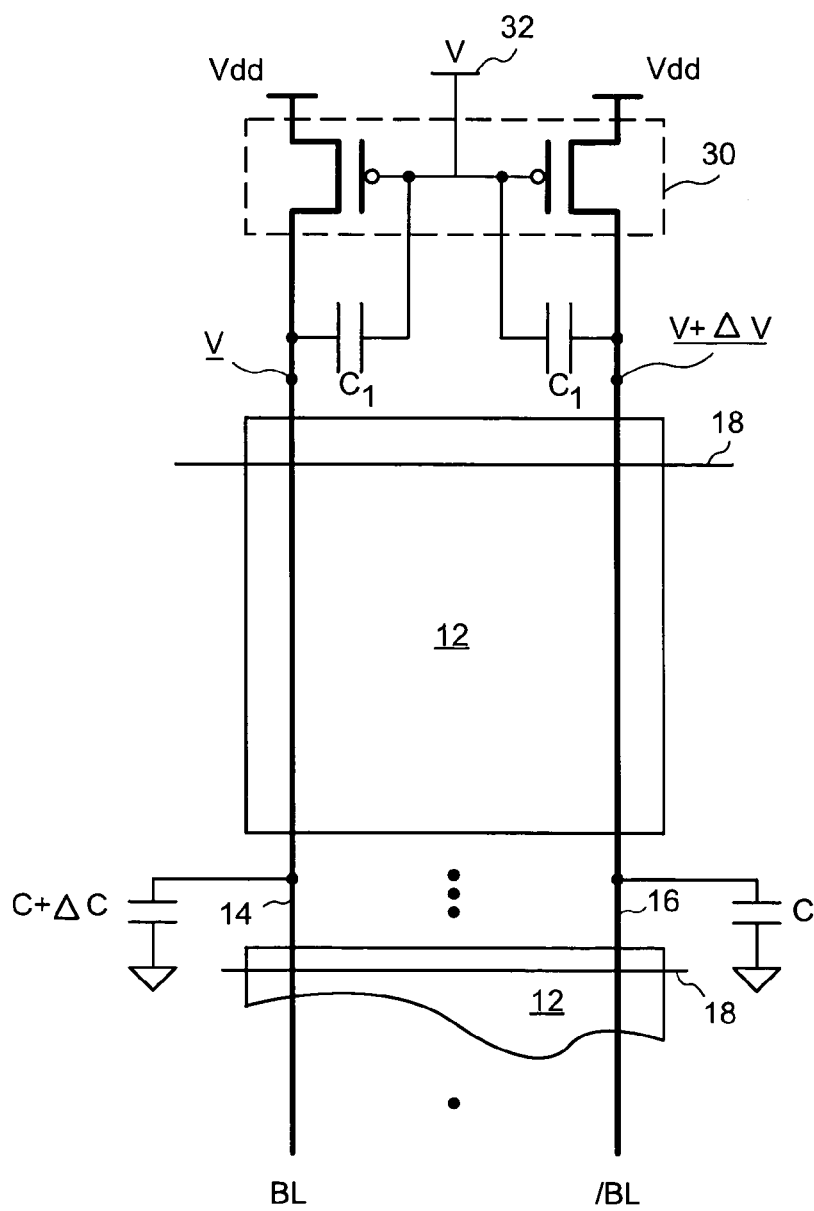
FIG. 1b illustrates a pair of exemplary bitlines that connect successive core cells in a vertical column (Prior Art)
Figure 1C:
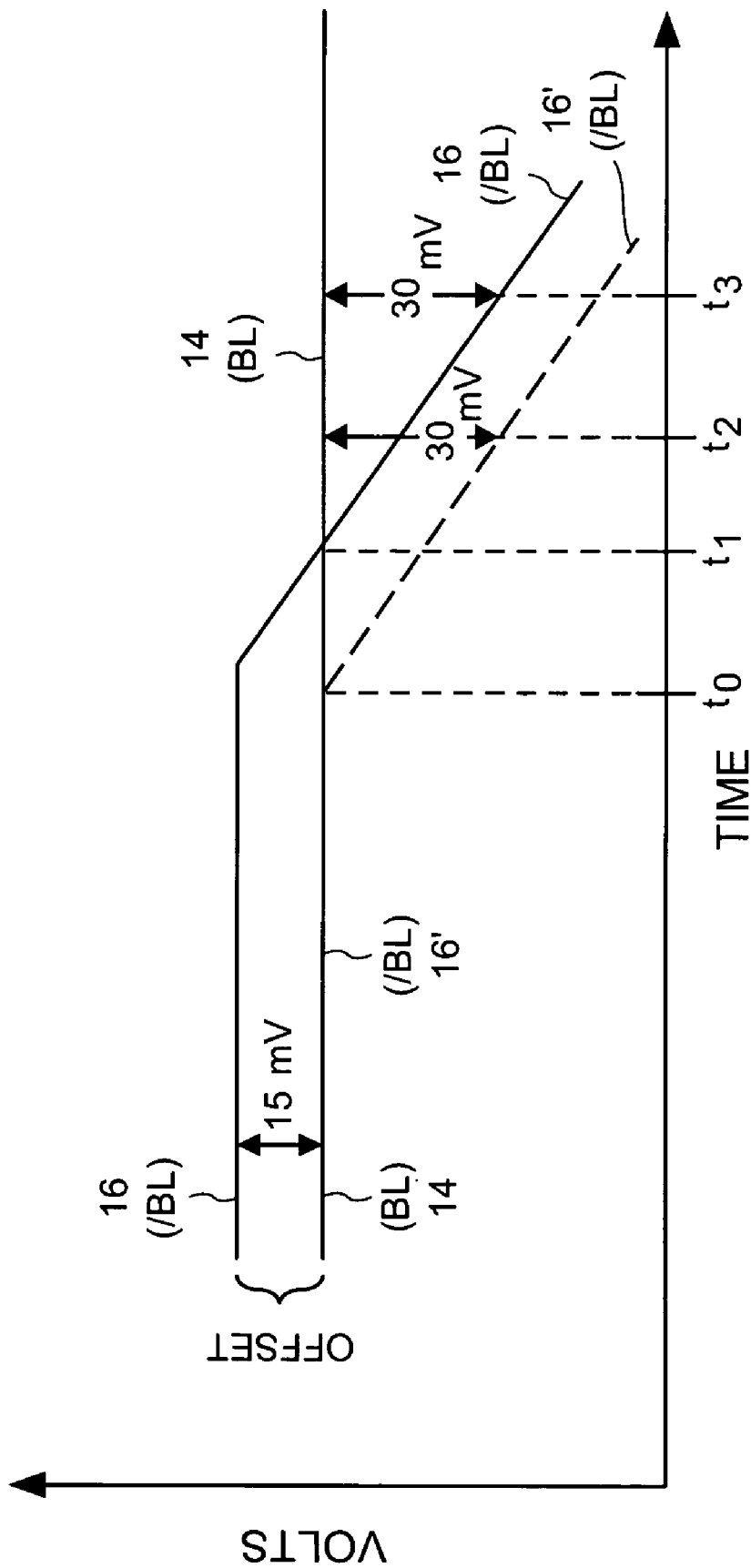
FIG. 1c illustrates a bitline and a complementary bitline graphed in terms of voltage and time, illustrating transitions during sense amplification operation (Prior Art)
Figure 2:
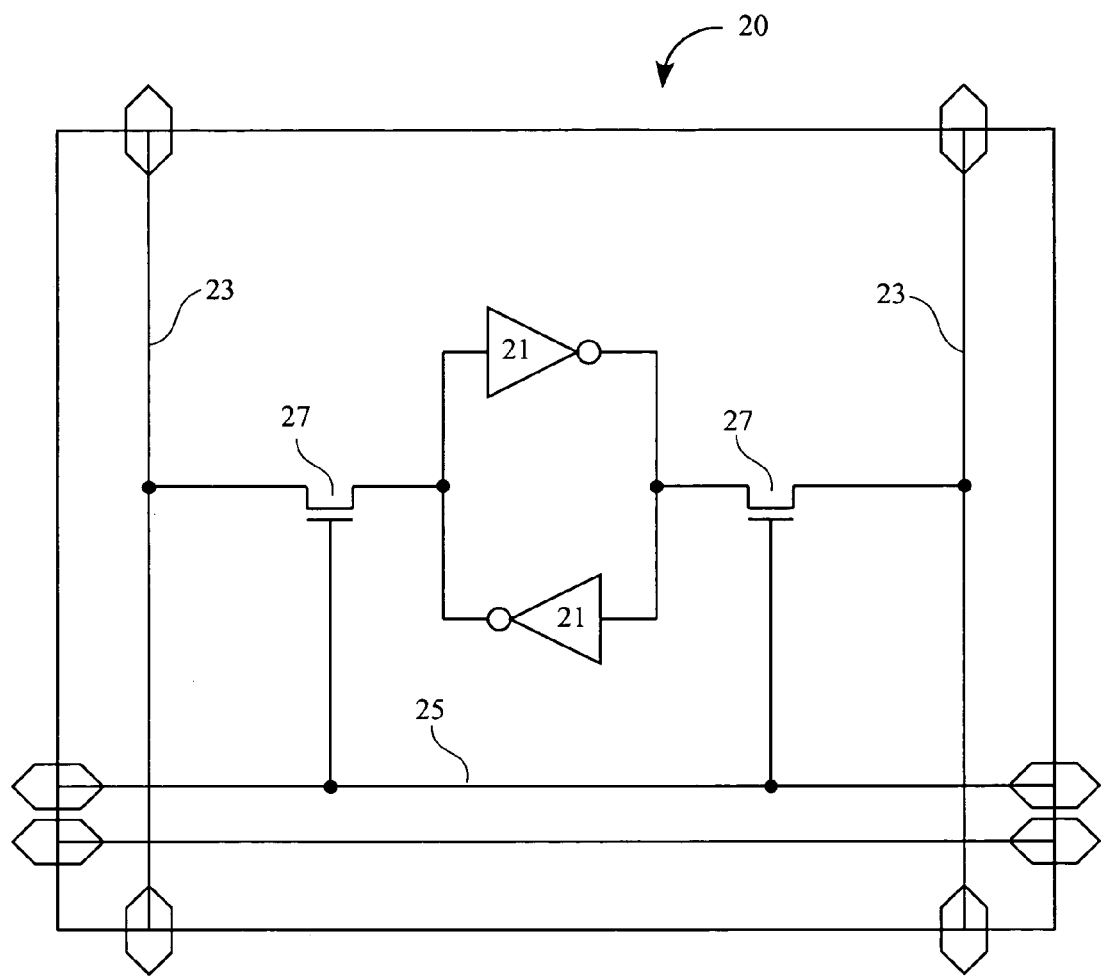
FIG. 2 is a block diagram of a known single port SRAM core cell (Prior Art)
Figure 3:
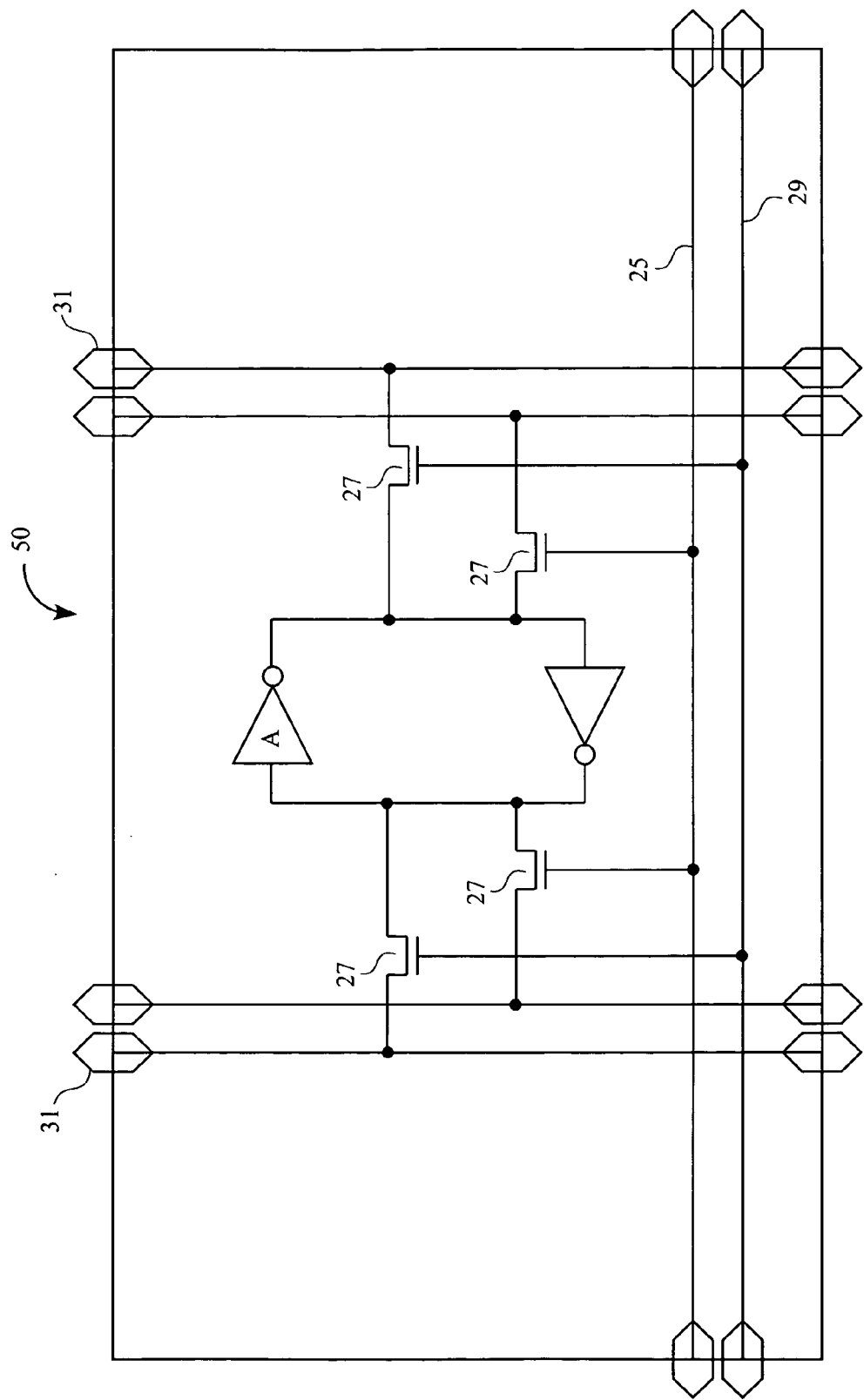
FIG. 3 is a block diagram of a known dual port SRAM core cell (Prior Art)
Figure 4:
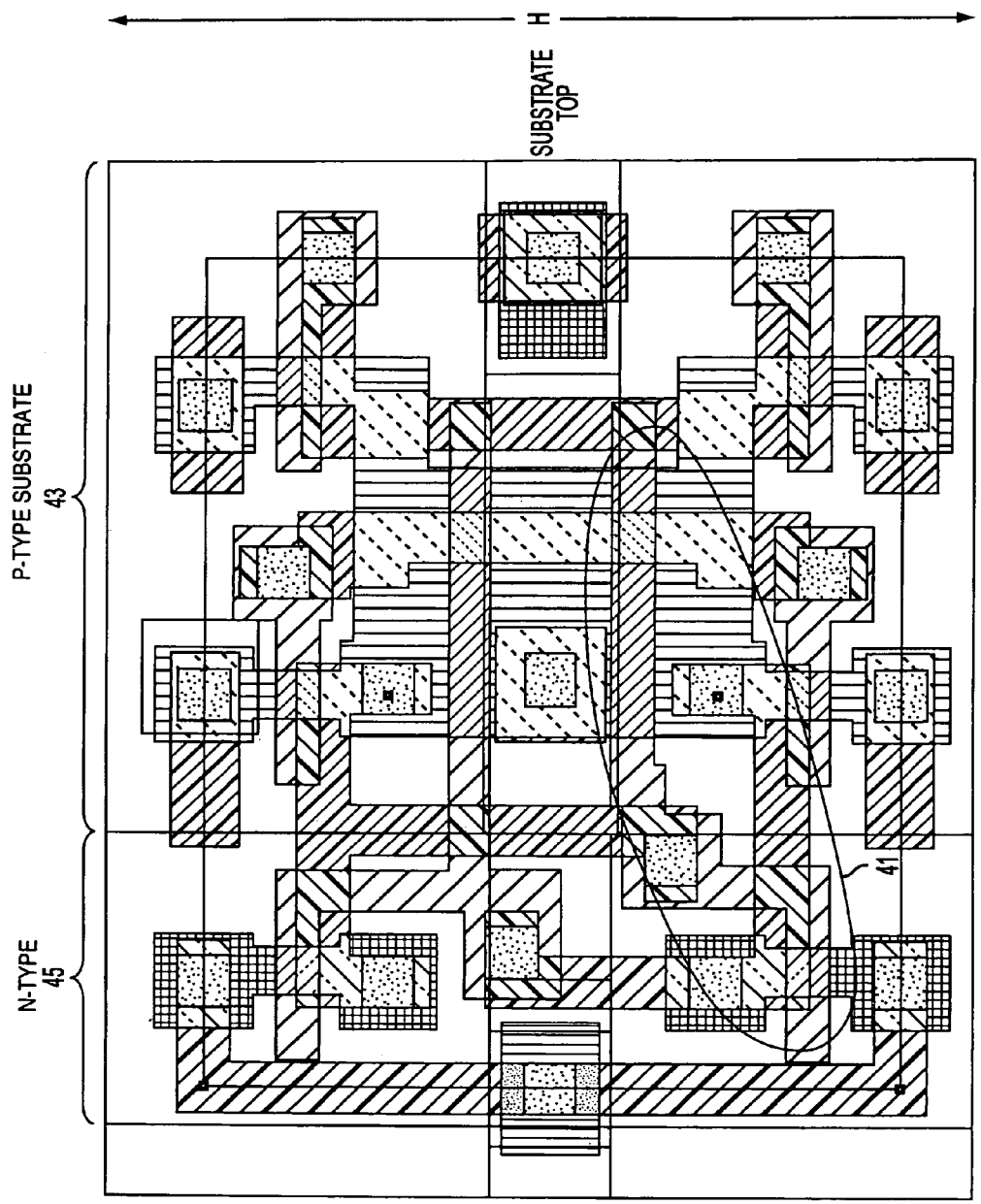
FIG. 4 is a top down perspective of the silicon layout of the known dual port memory cell of FIG. 3 (Prior Art)

The schematic diagram of memory core cell 100 (FIG. 5) would be identical to that shown in FIG. 3. The processes used to fabricate memory core cell 100 are known in the art and require no discussion here.

Figure 6:
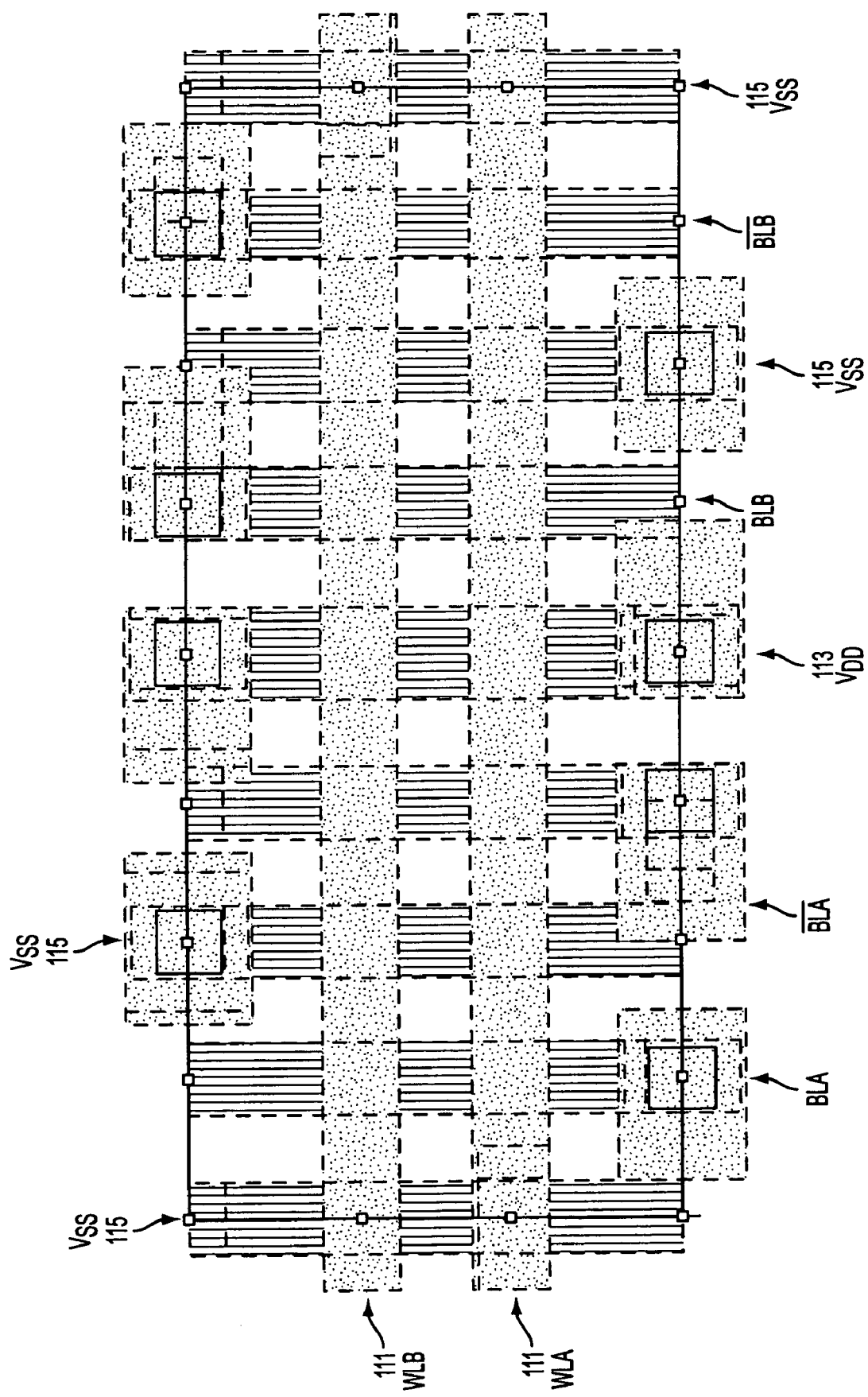
FIG. 6 is a top down perspective of the silicon layout of a first embodiment of the present invention, with the metalization layers illustrated.

As shown in FIG. 6, the two sets of bitlines are shown as bitline A, bitline/A, bitline B and bitline/B. Wordline contacts 111 turn on the passgate transistors when core cell 100 is addressed for reading or writing. $V_{dd}$ contacts 113 and ground contacts 115 indicate where voltage and ground are provided to core cell 100. Like the bitlines, these lines run parallel to one another, as well as parallel to the bitlines, down the columns of core cells (see FIG. 1a). This arrangement of the bitlines, power lines and ground lines, which is only allowed by the unique layout of the present invention, effectively shields the bitlines from one another, which greatly reduces charge coupling caused by the signals on the bit lines. This architecture allows both faster reading from and faster writing to core cells constructed according to the present invention. The vertical power and ground lines also improves the power grid structure.

Current IC design processes first propose a layout for the IC design and then use modeling software to determine its performance. When a model appears to indicate that a design will perform as required, test ICs are fabricated and their actual performance measured against the expected performance. The process repeats iteratively both at the modelling and at the fabricate and test stages until performance specifications are met. The architecture of this first embodiment of the present invention permits this iterative design process to produce an optimized design more easily than known cell architectures, especially in terms of balanced bit line capacitances as well as balanced internal node capacitances. The increased width and reduced height provide more effective space for varying the size and positioning of the core cell's active devices to obtain the optimal results.

The core cell of this embodiment of the present invention tiles well, as its symmetrical layout permits core cells to be flipped and rotated to offset bitline and word line voltage mismatches as necessary as the number of core cells in each column of the memory increases.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention not to be limited to the details given herein, but may be modified within the scope and equivalents of the appended claims.

What is claimed is:

1. A core cell, the core cell fabricated on a substrate, comprising:
    the substrate being defined of three columns of substrate material, the three columns of substrate material comprising a first p-type column, a first n-type column and a second p-type column, the n-type column being positioned between the first and second p-type columns; and
    a pair of bitlines coupled to the core cell, such that the bitlines are separated by at least one of a voltage supply line and a ground voltage line, the bitlines not running in parallel immediately adjacent to one another.

2. The core cell of claim 1, wherein the bitline and complementary bitline are separated by one of at least a ground line and a voltage supply line.

3. In a random access memory comprised of at least a plurality of core cells, a core cell, comprising:
    first p-type substrate;
    first n-type substrate;
    second p-type substrate, the first and second p-type substrates being positioned on opposite sides of the first n-type substrate; and
    a pair of bitlines coupled to the core cell, wherein the bitlines are separated by at least one of a voltage supply line and a ground voltage line, the bitlines not running in parallel immediately adjacent to one another.

4. The core cell of claim 3, wherein each substrate has a generally rectangular shape, the rectangles having substantially the same area.

5. The core cell of claim 3, wherein at least two PMOS transistors are fabricated on the first n-type substrate.

6. The core cell of claim 5, wherein at least 4 NMOS transistors are fabricated on the first and second p-type substrate.

7. The core cell of claim 6, wherein the two PMOS transistors and two NMOS transistors are coupled together to form two inverters, the two inverters being coupled together to form the core cell's storage element.

* * * * *